(12) United States Patent
Ye (10) Patent No.: US 10,666,210 B2
(45) Date of Patent: May 26, 2020

(54) LOW-RADIATION INTERFERENCE, HIGH-EFFICIENCY, HIGH-LINEARITY, AND HIGH-ROBUSTNESS POWER TUBE DRIVER OF CLASS-D AUDIO AMPLIFIER

(71) Applicant: SI EN TECHNOLOGY (XIAMEN) LIMITED, Xiamen (CN)

(72) Inventor: Chunhui Ye, Xiamen (CN)

(73) Assignee: SI EN TECHNOLOGY (XIAMEN) LIMITED, Xiamen, Fujian (CN)

( * ) Notice: Subject to any disclaimer, the term of this patent is extended or adjusted under 35 U.S.C. 154(b) by 101 days.

(21) Appl. No.: 16/019,548

(22) Filed: Jun. 27, 2018

(65) Prior Publication Data

US 2019/0149113 A1    May 16, 2019

(30) Foreign Application Priority Data

Nov. 10, 2017    (CN) .......................... 2017 1 1105733

(51) Int. Cl.
| H03F 3/217 | (2006.01) |
| H03F 1/26 | (2006.01) |
| H03F 1/02 | (2006.01) |
| H03F 1/32 | (2006.01) |
| H03F 1/56 | (2006.01) |

(52) U.S. Cl.
CPC ............. *H03F 3/2171* (2013.01); *H03F 1/02* (2013.01); *H03F 1/26* (2013.01); *H03F 1/32* (2013.01); *H03F 1/56* (2013.01); *H03F 3/217* (2013.01)

(58) Field of Classification Search
CPC ... H03F 3/72; H03F 1/04; H03F 3/217; H03F 3/58; H03F 2200/78; H03F 3/2173; H03F 3/2171; H03F 2200/432; H03F 2200/351
USPC .............................................. 330/207 A, 251
See application file for complete search history.

(56) References Cited

U.S. PATENT DOCUMENTS

| 8,975,956 B2* | 3/2015 | Sugawara | ............... H03F 3/217 330/10 |
| 9,083,283 B2* | 7/2015 | Sugawara | ............... H03F 3/217 |
| 9,467,097 B2* | 10/2016 | Kaya | ......................... H03F 1/32 |

* cited by examiner

*Primary Examiner* — Khanh V Nguyen
(74) *Attorney, Agent, or Firm* — Leong C. Lei (57) ABSTRACT

A power tube driver of a class-D audio amplifier includes high-side and low-side fixed charge/discharge gate driving circuits, high-side and low-side power tubes, a dead time generation circuit based on gate voltage detection, high-side and low-side gate charge/discharge accelerating circuits, and high-side and low-side gate voltage detection circuits. The class-D audio amplifier with the features of low radiation interference, and high efficiency, linearity and robustness can be balanced easily.

3 Claims, 8 Drawing Sheets

LOW-RADIATION INTERFERENCE, HIGH-EFFICIENCY, HIGH-LINEARITY, AND HIGH-ROBUSTNESS POWER TUBE DRIVER OF CLASS-D AUDIO AMPLIFIER

BACKGROUND OF THE INVENTION

1. Field of the Invention

The present disclosure relates to an audio amplifier, in particular to a power tube driver of a class-D audio amplifier.

2. Description of the Prior Art

In the last decade, class-D amplifiers with the feature of high efficiency gradually replaced the traditional class-AB amplifiers and became increasingly popular in the audio application of portable devices such as mobile phones, tablet PCs, etc. In the last few years, the class-D amplifier started its application in the area of motor vehicles.

The class-D amplifier is a switching amplifier which has an issue of large radiation interference in high-efficiency applications and also encounters more challenges in linearity and robustness than the traditional class-AB amplifiers.

Power tube driver is a core module of the class-D amplifier and its structural design determines the radiation interference, efficiency, linearity and robustness of the class-D amplifier. Previous structural designs using a fixed gate charge speed and a RC delay to generate a fixed dead time are unable to satisfy the aforementioned four aspects very well. Improvements on an aspect usually lead to a sacrifice of one or more of the other aspects:

1. Emphasis on low radiation interference may sacrifice efficiency and linearity.
2. Emphasis on high linearity may sacrifice radiation interference and robustness.

Figure 1:
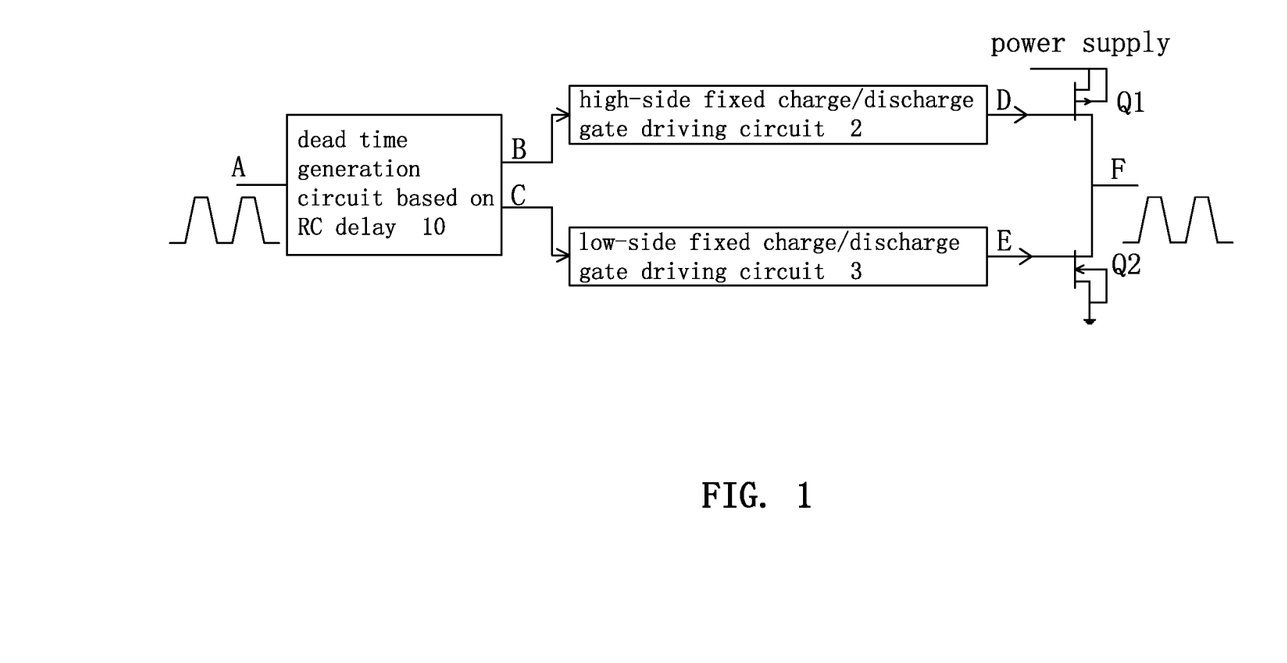
FIG. 1 is a schematic circuit block diagram of a conventional power tube driver of a class-D audio amplifier.

With reference to FIG. 1 for the schematic circuit diagram of a common power tube driver of a class-D audio amplifier, the power tube driver comprises a dead time generation circuit based on RC delay 10, a high-side fixed charge/discharge gate driving circuit 2, a low-side fixed charge/discharge gate driving circuit 3, a high-side power tube Q1 and a low-side power tube Q2. The dead time generation circuit based on RC delay 10 has an input terminal for inputting a square wave signal and an output terminal coupled to input terminals of the high-side fixed charge/discharge gate driving circuit 2 and the low-side fixed charge/discharge gate driving circuit 3. The output terminals of the high-side fixed charge/discharge gate driving circuit 2 and the low-side fixed charge/discharge gate driving circuit 3 are coupled to a gate of the high-side power tube Q1 and a gate of the low-side power tube Q2 respectively. A drain of the high-side power tube Q1 is coupled to a power supply, and a source of the low-side power tube Q2 is grounded, and a source of the high-side power tube Q1 and a drain of the low-side power tube Q2 are coupled together to form an output node.

This driving circuit includes 6 signal nodes which are an input signal A, a high-side power tube non-overlapping gate control signal B, a low-side power tube non-overlapping gate control signal C, a high-side power tube gate D, a low-side power tube gate E and an output signal F.

Figure 2:
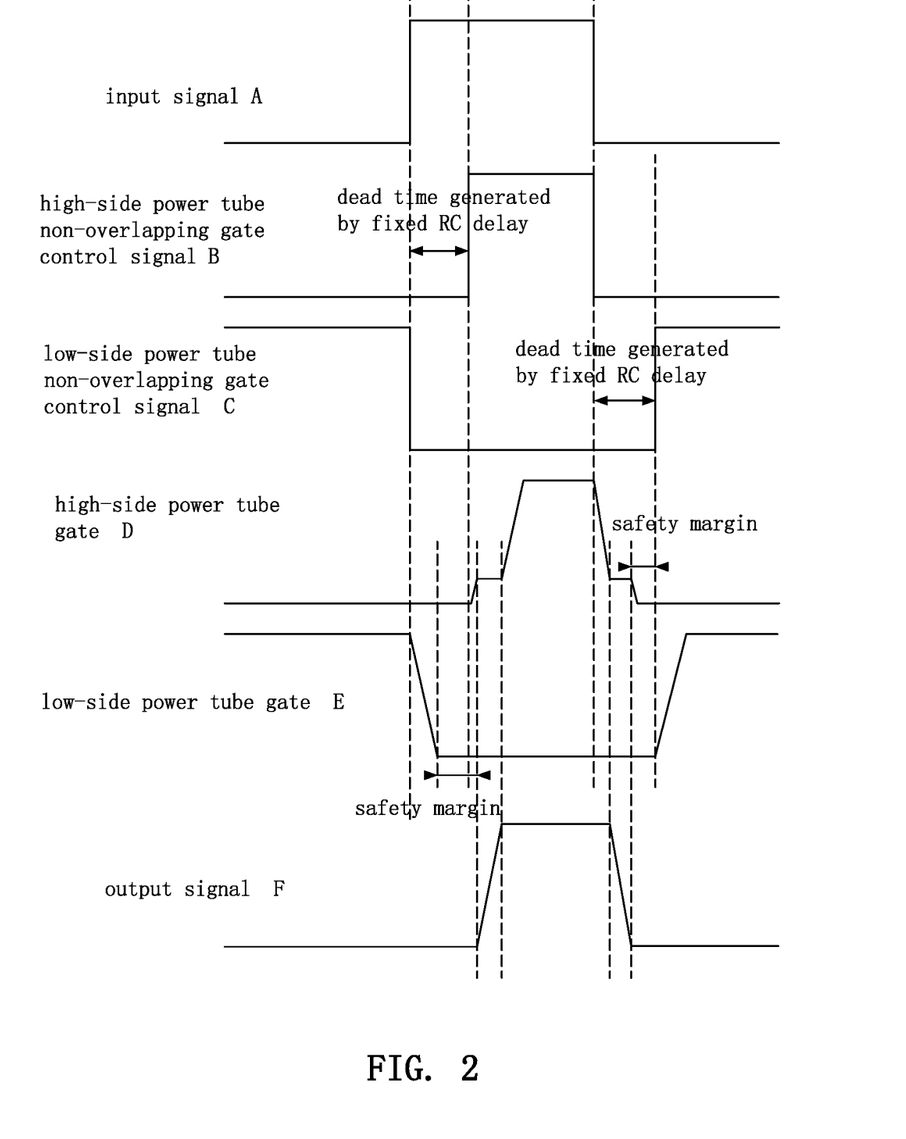
FIG. 2 is a waveform chart of each signal node of FIG. 1.

With reference to FIG. 2 for the waveform chart of each signal node of the driving circuit, the six signal nodes are described as follows:

1. Input signal A: The input signal A is a pulse width modulation (PWM) square wave signal. The signal in FIG. 2 starts at a low level, and goes through two switches.

2. High-side power tube non-overlapping gate control signal B: The high-side power tube non-overlapping gate control signal B is an inputted pulse width modulation (PWM) square wave signal which becomes an output signal after passing through the dead time generation circuit based on the RC delay 10 and has the same level direction with the inputted pulse width modulation (PWM) square wave signal, but delays a fixed RC delay time in the first switching time when compared with the inputted pulse width modulation (PWM) square wave signal.

3. Low-side power tube non-overlapping gate control signal C: The low-side power tube non-overlapping gate control signal C is also an inputted pulse width modulation (PWM) square wave signal and becomes an output signal after passing through the dead time generation circuit based on the RC delay 10 and has an opposite level direction from the pulse width modulation (PWM) square wave signal, and this signal C delays a fixed RC delay time in the second switching time when compared with the inputted pulse width modulation (PWM) square wave signal.

The design of RC time is used to guarantee that the high-side power tube Q1 and the low-side power tube Q2 will not be electrically conducted at the same time. Since it is unable to estimate the required delay accurately, a considerable safety margin is required for the design of the RC time to guarantee the appropriate robustness and the linearity of the amplifier and prevent damages.

4. High-side power tube gate D: The high-side power tube gate D starts changing to charge or discharge when the high-side power tube non-overlapping gate control signal B changes. Each stage of the charge/discharge of the high-side power tube gate D (except when outputting a change) has a constant slope. During a change of the output, the charge/discharge strength has not changed, and the gate voltage stands still just because of the drag of the Miller effect occurred in the output change.

5. Low-side power tube gate E: The charge or discharge starts changing after the low-side power tube non-overlapping gate control signal C has changed. Each stage of the charge/discharge of the low-side power tube gate E has a constant slope.

6. The output signal F starts changing when the high-side power tube gate D has reached the vicinity of its threshold. The slope of output change is determined by the power tube gate charge/discharge strength. The slope of output change determines the radiation interference, so that it is necessary to reduce the power tube gate charge/discharge strength to meet the design requirements. Since the conventional design adopts constant charge/discharge strength, a decrease of charge/discharge strength slows down the whole charge/discharge process and results in a significant drop of efficiency and linearity. Actually, the slope of output change decreasing with the charge/discharge strength will not give any positive effect to the radiation interference when the gate voltage is just situated in the vicinity of the threshold.

FIG. 2 shows the situation of an output current flowing out from the high-side power tube Q1, but the output current may also flow out from the low-side power tube Q2. When the output current flows out from the low-side power tube Q2, the output change will respond to the threshold of the low-side power tube gate, and the Miller effect will be shown in the low-side power tube gate voltage.

As the complexity of electronic systems becomes higher and higher, the radiation interference requirement becomes stricter, and the conventional design of the power tube driver no longer satisfy the requirements. To meet the radiation interference requirement, the conventional design has to sacrifice other features and becomes unacceptable. Therefore, a novel design is urgent needed to meet the increasingly demanding application requirements.

SUMMARY OF THE INVENTION

In view of the drawbacks of the prior art, it is a primary objective of this disclosure to provide a power tube driver of a class-D audio amplifier whose radiation interference, efficiency, linearity and robustness can be balanced more easily. In other words, the class-D audio amplifier is capable of reducing the radiation interference while achieving high efficiency, linearity and robustness.

To achieve the aforementioned and other objectives, this disclosure provides a low-radiation interference, high-efficiency, high-linearity, and high-robustness power tube driver of a class-D audio amplifier, comprising a high-side fixed charge/discharge gate driving circuit, a low-side fixed charge/discharge gate driving circuit, a high-side power tube, a low-side power tube, a dead time generation circuit based on a gate voltage detection, a high-side gate charge/discharge accelerating circuit, a low-side gate charge/discharge accelerating circuit, a high-side gate voltage detection circuit, and a low-side gate voltage detection circuit.

The dead time generation circuit based on the gate voltage detection has an input terminal for inputting a square wave signal, and an output terminal coupled to the input terminals of the high-side fixed charge/discharge gate driving circuit, the high-side gate charge/discharge accelerating circuit, the low-side fixed charge/discharge gate driving circuit and the low-side gate charge/discharge accelerating circuit. The output terminals of the high-side fixed charge/discharge gate driving circuit and the high-side gate charge/discharge accelerating circuit are jointly coupled to a gate of the high-side power tube, and the output terminals of the low-side fixed charge/discharge gate driving circuit and low-side gate charge/discharge accelerating circuit are jointly coupled to a gate of the low-side power tube. A drain of the high-side power tube is coupled to a power supply, and a source of the low-side power tube is grounded, and a source of the high-side power tube is coupled to a drain of the low-side power tube to form an output node. The high-side gate voltage detection circuit has an input terminal coupled to a gate of the high-side power tube and an output terminal coupled to a feedback input terminal of the dead time generation circuit based on the gate voltage detection, and a feedback input terminal of the high-side gate charge/discharge accelerating circuit, and the high-side gate charge/discharge accelerating circuit has an output terminal coupled to a gate of the high-side power tube. The low-side gate voltage detection circuit has an input terminal coupled to a gate of the low-side power tube and an output terminal coupled to a feedback input terminal of the dead time generation circuit based on the gate voltage detection and a feedback input terminal of the low-side gate charge/discharge accelerating circuit, and the output terminal of the low-side gate charge/discharge accelerating circuit is coupled to a gate of the low-side power tube.

The high-side gate voltage detection circuit and the low-side gate voltage detection circuit have the same structure, and both of them comprise a comparator I and a comparator II which are two identical comparators, and a corresponding input terminal of the comparator I and the comparator II is coupled to the gates of the high-side power tube or the low-side power tube, and the other corresponding input terminal of the comparator I and the comparator II is coupled to a gate detection level I and a gate detection level II; and the gate detection level II has a voltage equal to the threshold voltage for timing on the high-side power tube or the low-side power tube, and the gate detection level I has a voltage higher than the voltage of the gate detection level and the output of the comparator I is the gate detection output I, and the output of the comparator II is the gate detection output II.

The high-side gate charge/discharge accelerating circuit and the low-side gate charge/discharge accelerating circuit have the same structure, and both comprise a first NOT gate, an OR gate, a NAND gate, a second NOT gate, a NOR gate, gate charge accelerating tube and a gate discharge accelerating tube, and the first NOT gate has an input terminal coupled to the gate detection output II and an output terminal coupled to an input terminal of the OR gate, and the other input terminal of the OR gate is coupled to the gate detection output I, and the OR gate has an output terminal coupled to an input terminal of the NAND gate and an input terminal of the second NOT gate, and the second NOT gate has an output terminal coupled to an input terminal of the NOR gate, and the corresponding output terminal of the dead time generation circuit based on the gate voltage detection is coupled to the other input terminal of the NAND gate and the other input terminal of the NOR gate, and the NAND gate has an output terminal coupled to a gate of the gate charge accelerating tube, and the gate charge accelerating tube has a drain coupled to the power supply, and the NOR gate has an output terminal coupled to a gate of the gate discharge accelerating tube, and a source of the gate discharge accelerating tube is grounded, and the source of the gate charge accelerating tube and the drain of the gate discharge accelerating tube are jointly coupled to the gates of the high-side power tube or the low-side power tube.

Compared with the prior art, the power tube driver of the class-D audio amplifier in accordance with this disclosure has the following beneficial effects:

1. In this disclosure, a novel "Detection-Segmentation Charge/Discharge" method for controlling the speed of the gate charge/discharge (charging when the power tube is turned on, and discharging when the power tube is turned off) is designed. At different power tube charge/discharge stages, different charge/discharge speeds are provided respectively. In a charge/discharge stage without affecting the radiation interference, a quick charge/discharge is provided to guarantee high efficiency and linearity. At a charge/discharge stage affecting the radiation interference (or the power tube has a voltage falling within the vicinity of the threshold voltage), a slow charge/discharge is provided to reduce the radiation interference. In the conventional fixed gate charge method, if the radiation interference is reduced, it will be necessary to slow down the whole charge/discharge process, and thus the efficiency and linearity will be lowered significantly.

2. In this disclosure, a "Detection-Cross Feedback" dead time control method is adopted. When the power tube switches and changes its operation, the power tube gate voltage on the side to be shutdown is detected first to assure that the gate voltage is lower than the threshold voltage. After such gate voltage is confirmed to be shutdown, the power tube on the other side is turned on. Such arrangement makes sure that both high- and low-side power tubes will not be electrically conducted at the same time (so as to guarantee the high robustness) without producing additional dead time, so that the linearity will not be affected adversely. In the conventional way of producing dead time by the RC delay, there are no detection and feedback structures, the required precise gate discharge time is not known, so that the design usually adds a safety margin for the prediction of the gate discharge time to guarantee the high robustness. However, the existence of the safety margin affects the linearity of the amplifier adversely. In the novel design of this disclosure, a precise gate discharge time can be obtained to complete the signal without requiring any safety margin at all. This disclosure not just improves the linearity only, but also guarantees the high robustness.

DETAILED DESCRIPTION OF THE PREFERRED EMBODIMENTS

To understand the technical characteristics of this disclosure intuitively and comprehensively, exemplary embodiments are used and illustrated in referenced figures of the drawings. It is intended that the embodiments and figures disclosed herein are to be considered illustrative rather than restrictive.

Figure 3:
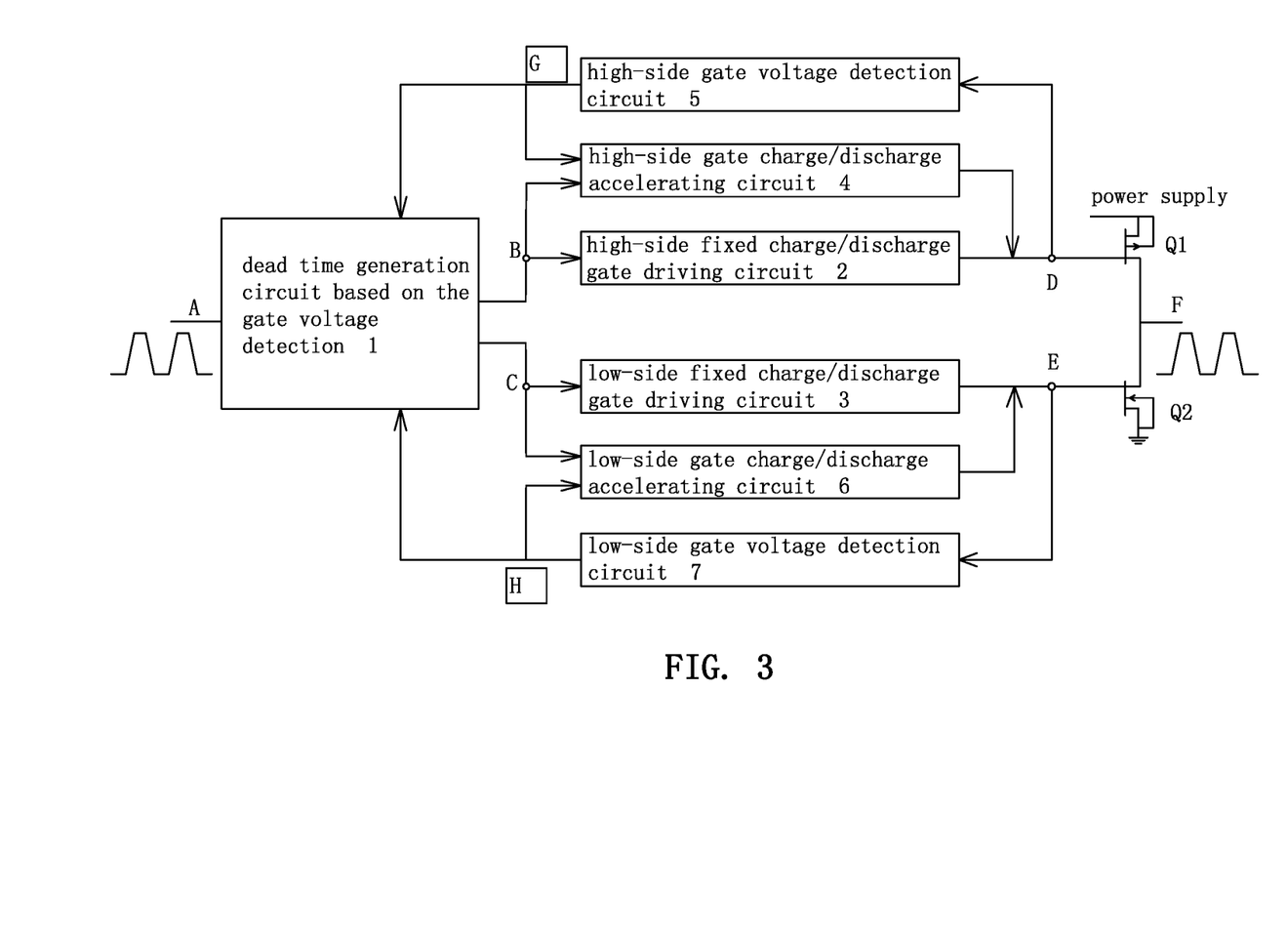
FIG. 3 is a schematic circuit block diagram of a power tube driver of a class-D audio amplifier of this disclosure.

With reference to FIG. 3 for a low-radiation interference, high-efficiency, high-linearity, and high-robustness power tube driver of a class-D audio amplifier in accordance with this disclosure, the power tube driver comprises a dead time generation circuit based on a gate voltage detection 1, a high-side fixed charge/discharge gate driving circuit 2, a low-side fixed charge/discharge gate driving circuit 3, a high-side gate charge/discharge accelerating circuit 4, a high-side gate voltage detection circuit 5, a low-side gate charge/discharge accelerating circuit 6, a low-side gate voltage detection circuit 7, a high-side power tube Q1, and a low-side power tube Q2.

The dead time generation circuit based on gate voltage detection 1 has an input terminal for connecting and outputting a square wave signal and an output terminal coupled to the input terminals of the high-side fixed charge/discharge gate driving circuit 2, the high-side gate charge/discharge accelerating circuit 4, the low-side fixed charge/discharge gate driving circuit 3 and the low-side gate charge/discharge accelerating circuit 6. The output terminals of the high-side fixed charge/discharge gate driving circuit 2 and the high-side gate charge/discharge accelerating circuit 4 are jointly coupled to a gate of the high-side power tube Q1, and the output terminals of the low-side fixed charge/discharge gate driving circuit 3 and the low-side gate charge/discharge accelerating circuit 6 are jointly coupled to a gate of the low-side power tube Q2; a drain of the high-side power tube Q1 is coupled to a power supply, and a source of the low-side power tube Q2 is grounded, and a source of the high-side power tube Q1 and a drain of the low-side power tube Q2 are coupled together to form an output node.

The high-side gate voltage detection circuit 5 has an input terminal coupled to a gate of the high-side power tube Q1 and an output terminal coupled to a feedback input terminal of the dead time generation circuit based on the gate voltage detection 1 and a feedback input terminal of the high-side gate charge/discharge accelerating circuit 4, and an output terminal of the high-side gate charge/discharge accelerating circuit 4 is coupled to a gate of the high-side power tube Q1.

The low-side gate voltage detection circuit 7 has an input terminal coupled to a gate of the low-side power tube Q2 and an output terminal coupled to a feedback input terminal of the dead time generation circuit based on gate voltage detection 1 and a feedback input terminal of the low-side gate charge/discharge accelerating circuit 6, and an output terminal of the low-side gate charge/discharge accelerating circuit 6 is coupled to a gate of the low-side power tube Q2.

The power tube driver of the class-D audio amplifier of this disclosure includes eight signal nodes which are an input signal A, a high-side power tube non-overlapping gate control signal B, a low-side power tube non-overlapping gate control signal C, a high-side power tube gate D, a low-side power tube gate E, an output signal F, a high-side power tube gate detection output signal G, and a low-side power tube gate detection output signal H.

Figure 4:
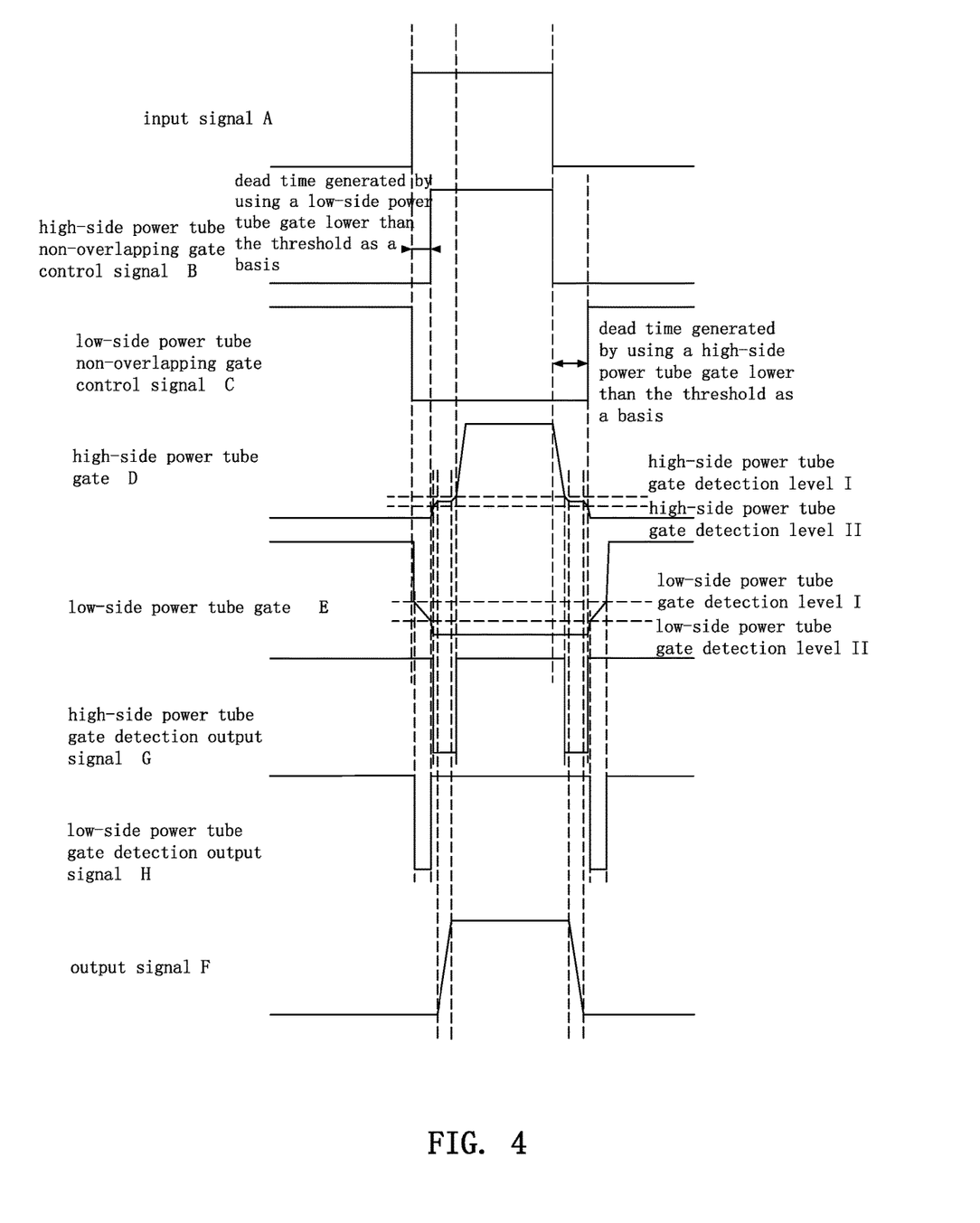
FIG. 4 is a waveform chart of each signal node of FIG. 3.

With reference to FIG. 4 for the waveform chart of each signal node A-H in accordance with this disclosure, the signal nodes A-H are described as follows:

1. Input signal A: The input signal A is a pulse width modulation (PWM) square wave signal. In FIG. 4, the signal is started at a low level, and switched twice.

2. High-side power tube non-overlapping gate control signal B: The high-side power tube non-overlapping gate control signal B is an inputted pulse width modulation (PWM) square wave signal and becomes an output signal after passing through the dead time generation circuit based on the gate voltage detection 1. The high-side power tube non-overlapping gate control signal B has the same level direction with the pulse width modulation (PWM) square wave signal, but the first switching time has to wait till the gate voltage of the low-side power tube Q2 is lower than the low-side power tube gate detection level II, or when the low-side power tube Q2 is shut down.

3. Low-side power tube non-overlapping gate control signal C: The low-side power tube non-overlapping gate control signal C is also an inputted pulse width modulation (PWM) square wave signal and becomes an output signal after passing through the dead time generation circuit based on the gate voltage detection 1, and the low-side power tube non-overlapping gate control signal C has a level direction opposite to that of the pulse width modulation (PWM) square wave signal, and the second switching time has to wait till the gate voltage of the high-side power tube Q1 is lower than the high-side power tube gate detection level II, or when the high-side power tube Q1 is shut down.

The design of the gate voltage detection is used to guarantee that the high-side power tube Q1 and the low-side power tube Q2 will not be electrically conducted at the same time. When a gate voltage on one side is detected to be lower than the power tube gate detection level II of that side, it shows that the power tube on that side has been shut down completely. Since the instant detection method is adopted, this disclosure does not require an additional safety margin to guarantee high robustness. The linearity of the amplifier will not be affected adversely while satisfying the requirements for high robustness.

4. High-side power tube gate D: After the high-side power tube non-overlapping gate control signal B changes, the high-side power tube gate D starts changing to charge or discharge. If the gate voltage of the high-side power tube gate D is lower than high-side power tube gate detection level II or higher than high-side power tube gate detection level I, the charge/discharge of the high-side power tube gate D will be very fast. If the gate voltage of the high-side power tube gate D is higher than the high-side power tube gate detection level II and lower than the high-side power tube gate detection level I, the charge/discharge of the high-side power tube gate D will be slow. When there is an output change, the charge/discharge strength actually has no change, and the gate voltage becomes stagnant simply due to the Miller effect produced by the output change.

5. Low-side power tube gate E: After the low-side power tube non-overlapping gate control signal C changes, the low-side power tube gate E starts changing to charge or discharge. If the gate voltage of the low-side power tube gate E is lower than the low-side power tube gate detection level II or higher than the low-side power tube gate detection level I, the charge/discharge of the low-side power tube gate E will be very fast. If the gate voltage of the low-side power tube gate E is higher than the low-side power tube gate detection level II and lower than the low-side power tube gate detection level I, the charge/discharge of the low-side power tube gate E will be slow.

6. High-side power tube gate detection output signal G: It is an output signal of the high-side gate voltage detection circuit 5 and reflects the voltage stage of the high-side power tube gate D. If the gate voltage of the high-side power tube gate D is lower than the high-side power tube gate detection level II or higher than the high-side power tube gate detection level I, the signal G will be at a high level, and if the gate voltage of the high-side power tube gate D is higher than the high-side power tube gate detection level II and lower than the high-side power tube gate detection level I, the signal G will be at a low level.

7. Low-side power tube gate detection output signal H: It is an output signal of the low-side gate voltage detection circuit 7 and reflects the voltage stage of the low-side power tube gate. If the gate voltage of the low-side power tube gate is lower than the power tube gate detection level 2 or higher than power tube gate detection level 1, the signal will be at a high level, and if the gate voltage of the low-side power tube gate is higher than the power tube gate detection level 2 and lower than the power tube gate detection level 1, the signal will be at a low level.

8. Output signal F: When the gate voltage of the high-side power tube gate D or low-side power tube gate E has reached the vicinity of its threshold, the output signal F starts changing. The slope of output change is determined by the charge/discharge strength when the gate voltage of the high-side power tube gate D or the low-side power tube gate E is situated in the vicinity of the threshold. The slope of output change determines the radiation interference, so that we will reduce the gate voltage of the high-side power tube gate D or the low-side power tube gate E situated in the vicinity of its threshold in order to meet the design requirements. Since this disclosure adopts the segmentation controlled charge/discharge strength which is not situated in the vicinity of the threshold (or at a stage not affecting the radiation interference), the charge/discharge is still very fast, and the whole charge/discharge process will not be slowed down by the charge/discharge strength of the gate situated in the vicinity of the threshold, so as to guarantee that the efficiency and linearity will not be affected unnecessarily.

FIG. 4 shows the situation of the output current flowing out from the high-side power tube Q1. In another situation, the output current may flow out from the low-side power tube Q2. If the output current flows out from the low-side power tube Q2, the output change will be corresponding to the voltage threshold of the low-side power tube gate, and Miller effect will show up in the voltage of the low-side power tube gate.

Figure 5:
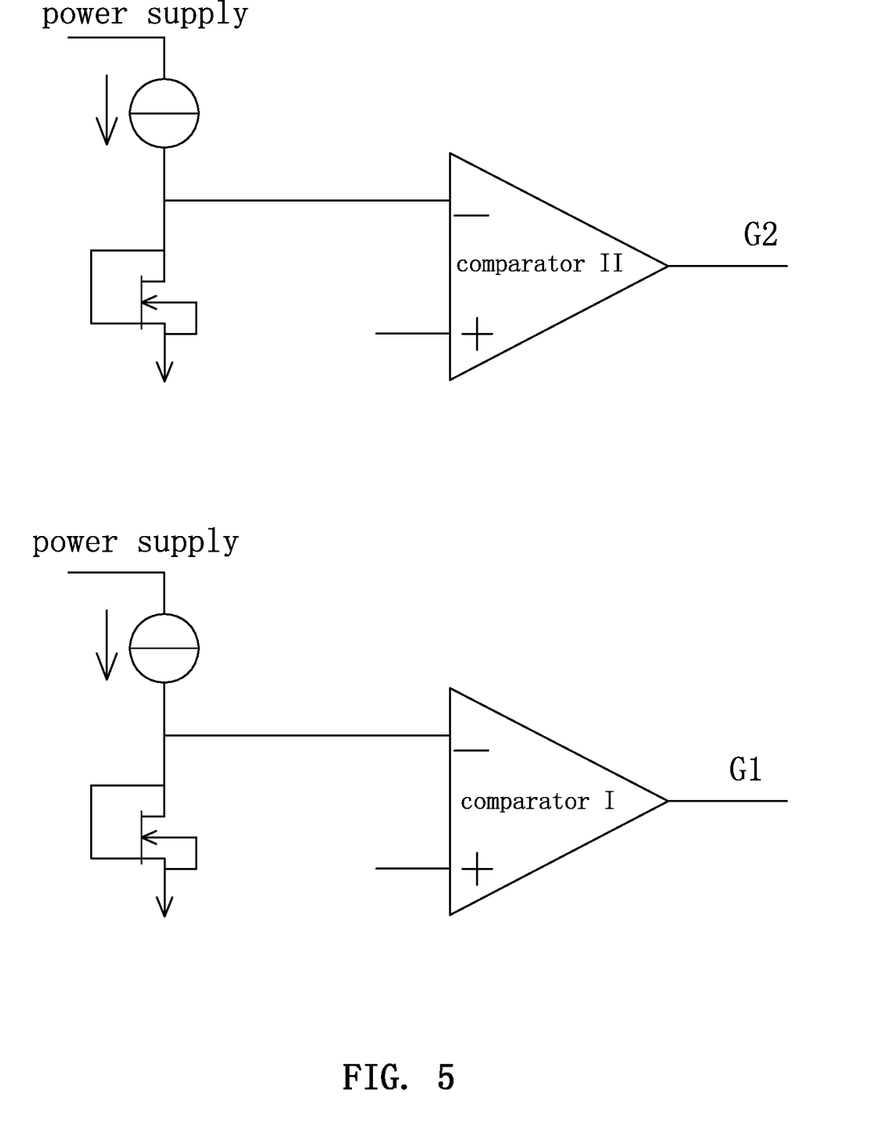
FIG. 5 is a schematic circuit block diagram of a high-side gate voltage detection circuit of this disclosure.
Figure 6:
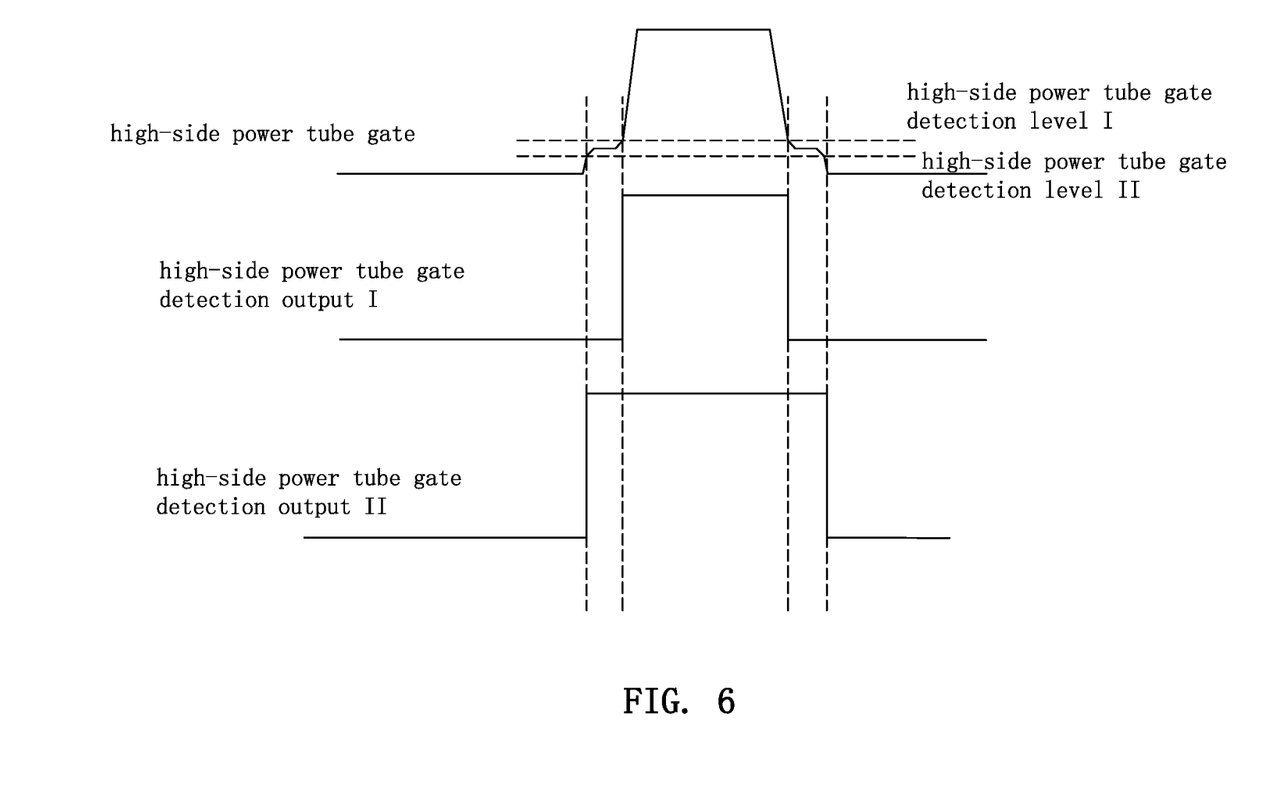
FIG. 6 is a waveform chart of each signal node of FIG. 5.

In this disclosure, the high-side gate voltage detection circuit 5 and the low-side gate voltage detection circuit 7 have the same circuit architecture and working principle. In this embodiment, the high-side gate voltage detection circuit 5 is used for illustration. FIG. 5 shows the schematic circuit block diagram of the circuit high-side gate voltage detection circuit 5, and FIG. 6 shows the waveform of each signal node of FIG. 5.

In FIG. 5, the high-side gate voltage detection circuit 5 includes a comparator I and a comparator II, and the comparator I and comparator II are two identical comparators, and both non-inverting input terminals of the comparator I and comparator II are jointly coupled to the high-side power tube gate D, and both inverting input terminals of the comparator I and comparator II are coupled to the high-side power tube gate detection level I and the high-side power tube gate detection level II respectively. The output of the comparator I is a high-side power tube gate detection output I G1, and the output of the comparator II is a high-side power tube gate detection output II G2, and the high-side power tube gate detection output I G1 and the high-side power tube gate detection output II G2 are corresponding to the comparison results of the high-side power tube gate D with the high-side power tube gate detection level I and the high-side power tube gate detection level II respectively.

The high-side power tube gate detection level I and the high-side power tube gate detection level II are two different voltage levels. The voltage of the high-side power tube gate detection level II is equal to the threshold voltage of turning on the high-side power tube Q1 and it is used for determining whether or not the power tube starts to turn on. The voltage of the high-side power tube gate detection level I is higher than the voltage of the high-side power tube gate detection level and it is used for determining whether or not the high-side power tube Q1 is turned on sufficiently.

If the gate voltage of the high-side power tube Q1 is lower than the high-side power tube gate detection level II, the high-side power tube gate detection output II G2 is logically low, and it indicates that the high-side power tube Q1 has not reached the startup threshold, and thus a fast charge/discharge may be used. If the high-side power tube Q1 is about to shut down and it indicates that the high-side power tube Q1 is lower than the startup threshold and is turned off completely, so that the low-side power tube Q2 may be turned on. If the gate voltage of the high-side power tube Q1 is higher than the high-side power tube gate detection level II, the high-side power tube gate detection output II G2 will be logically high, and it indicates that the high-side power tube Q1 starts to turn on.

If the gate voltage of the high-side power tube Q1 is lower than the high-side power tube gate detection level I, the high-side power tube gate detection output I G1 will be logically low. When the high-side power tube gate detection output II G2 is logically high at this point, the high-side power tube Q1 is being turned on, but has not been turned on completely, so that a slow charge/discharge should be used. If the gate voltage of the high-side power tube Q1 is higher than the high-side power tube gate detection level I, the high-side power tube gate detection output I G1 will be logically high, and it indicates that the high-side power tube Q1 has been turned on completely, so that a fast charge/discharge may be used.

In FIG. 5, the high-side power tube gate detection level I may be achieved by a large DC current together with a MOS tube matched with the high-side power tube Q1. The high-side power tube gate detection level II may be achieved by a small DC current together with a MOS tube matched with the high-side power tube Q1.

Figure 7:
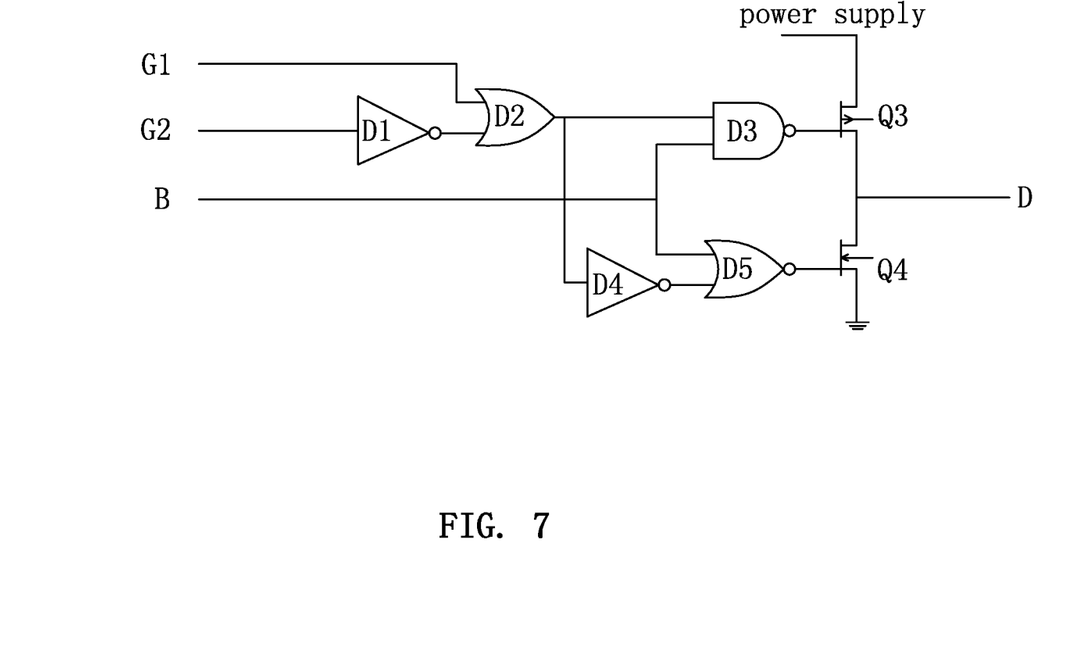
FIG. 7 is a schematic circuit block diagram of a high-side gate charge/discharge accelerating circuit of this disclosure.

In this disclosure, the high-side gate charge/discharge accelerating circuit 4 and the low-side gate charge/discharge accelerating circuit 6 have the same structure and working principle. In this embodiment, the high-side gate charge/discharge accelerating circuit 4 is used for illustration. FIG. 7 shows the schematic circuit block diagram of the high-side gate charge/discharge accelerating circuit 4 and FIG. 8 shows the waveform of each signal node of FIG. 7.

In FIG. 7, the high-side gate charge/discharge accelerating circuit 4 comprises a first NOT gate D1, an OR gate D2, a NAND gate D3, a second NOT gate D4, a NOR gate D5, a gate charge accelerating tube Q3 and a gate discharge accelerating tube Q4, wherein the first NOT gate D1 has an input terminal coupled to the high-side power tube gate detection output II G2, and an output terminal coupled to an input terminal of the OR gate D2, and the other input terminal of the OR gate D2 is coupled to the high-side power tube gate detection output I G1, and an output terminal of the OR gate D2 is coupled to an input terminal of the NAND gate D3 and an input terminal of the second NOT gate D4, and an output terminal of the second NOT gate D4 is coupled to an input terminal of the NOR gate D5, and the high-side power tube non-overlapping gate control signal B is coupled to the other input terminal of the NAND gate D3 and the other input terminal of the NOR gate D5, and an output terminal of the NAND gate D3 is coupled to a gate of the gate charge accelerating tube Q3, and a drain of the gate charge accelerating tube Q3 is coupled to a power supply, and an output terminal of the NOR gate D5 is coupled to a gate of the gate discharge accelerating tube Q4, and a source of the gate discharge accelerating tube Q4 is grounded, and a source of the gate charge accelerating tube Q3 and a drain of the gate discharge accelerating tube Q4 are jointly coupled to the high-side power tube gate D.

Figure 8:
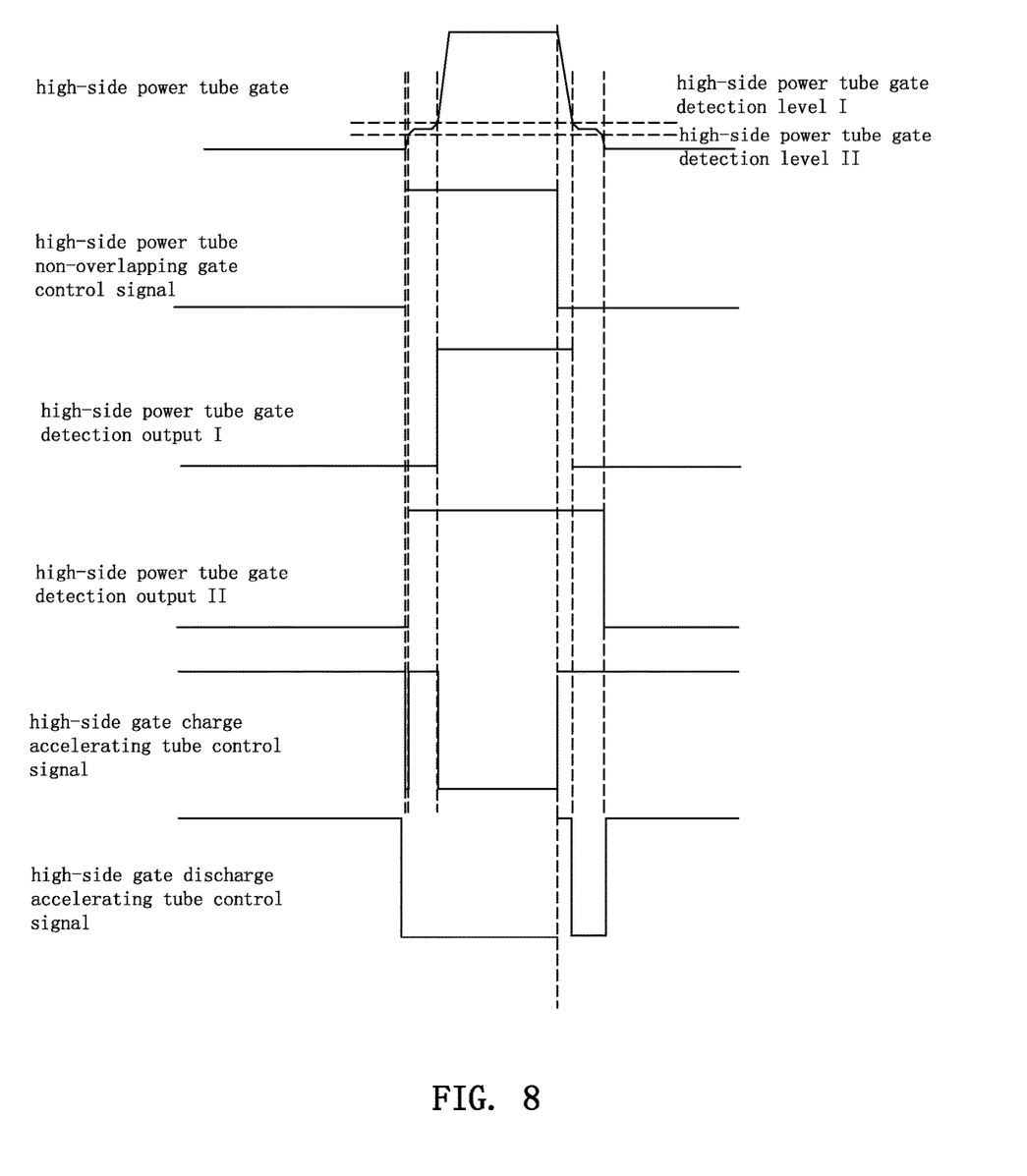
FIG. 8 is a waveform chart of each signal node of FIG. 7.

In FIG. 8, if the high-side power tube non-overlapping gate control signal B is at a high level, the high-side power tube Q1 will enter into a charge stage. When the high-side power tube gate detection output II G2 is at a low level in the charge stage, it shows that the high-side power tube Q1 has not been turned on, so that the accelerating tube may be used for acceleration. Now, the control signal of the gate charge accelerating tube Q3 is expressed in the form of a narrow low level pulse, and the gate charge accelerating tube Q3 is turned on shortly. When the high-side power tube gate detection output II G2 is at a high level and the high-side power tube gate detection output I G1 is at a low level, it indicates that the high-side power tube Q1 starts its startup process and should not be accelerated. Now, the control signal of the gate charge accelerating tube Q3 becomes a high level, and the gate charge accelerating tube Q3 is shut down. When the high-side power tube gate detection output I G1 is at a high level, it indicates that the high-side power tube Q1 has been turned on completely, so that the accelerating tube may be used for acceleration. Now, the control signal of the gate charge accelerating tube Q3 becomes low again, until the high-side power tube non-overlapping gate control signal B becomes low.

If the high-side power tube non-overlapping gate control signal B is at a low level, the high-side power tube Q1 will enter into a discharge stage. When the high-side power tube gate detection output I G1 is at a high level in the discharge stage, it indicates that the high-side power tube Q1 is turned on completely, so that the accelerating tube may be used for acceleration. Now, the control signal of the gate discharge accelerating tube Q4 is expressed in the form of a narrow high level pulse. When the high-side power tube gate detection output II G2 is at a high level and the high-side power tube gate detection output I G1 is at a low level, it indicates that the high-side power tube Q1 starts the shut-down process, and should not be accelerated. Now, the control signal of the gate discharge accelerating tube Q4 becomes low, and the gate discharge accelerating tube Q4 is shut down. When the high-side power tube gate detection output II G2 is at a low level, it indicates that the high-side power tube Q1 has been shut down completely, so that the accelerating tube may be used for acceleration. Now, the control signal of the gate discharge accelerating tube Q4 becomes high again.

While this disclosure has been described by means of specific embodiments, numerous modifications and variations could be made thereto by those skilled in the art without departing from the scope and spirit of the invention set forth in the claims.

What is claimed is:

1. A low-radiation interference, high-efficiency, high-linearity, and high-robustness power tube driver of a class-D audio amplifier, comprising a high-side fixed charge/discharge gate driving circuit; a low-side fixed charge/discharge gate driving circuit; a high-side power tube; a low-side power tube; a dead time generation circuit based on a gate voltage detection; a high-side gate charge/discharge accelerating circuit; a low-side gate charge/discharge accelerating circuit; a high-side gate voltage detection circuit; and a low-side gate voltage detection circuit; characterized in that:

the dead time generation circuit based on the gate voltage detection has an input terminal for inputting a square wave signal, and an output terminal coupled to input terminals of the high-side fixed charge/discharge gate driving circuit, the high-side gate charge/discharge accelerating circuit, the low-side fixed charge/discharge gate driving circuit and the low-side gate charge/discharge accelerating circuit; output terminals of the high-side fixed charge/discharge gate driving circuit and the high-side gate charge/discharge accelerating circuit are jointly coupled to a gate of the high-side power tube, and output terminals of the low-side fixed charge/discharge gate driving circuit and the low-side gate charge/discharge accelerating circuit are jointly coupled to a gate of the low-side power tube; a drain of the high-side power tube is coupled to a power supply, and a source of the low-side power tube is grounded, and a source of the high-side power tube is coupled to a drain of the low-side power tube to form an output node;

the high-side gate voltage detection circuit has an input terminal coupled to a gate of the high-side power tube and an output terminal coupled to a feedback input terminal of the dead time generation circuit based on the gate voltage detection, and a feedback input terminal of the high-side gate charge/discharge accelerating circuit, and the high-side gate charge/discharge accelerating circuit has an output terminal coupled to a gate of the high-side power tube;

the low-side gate voltage detection circuit has an input terminal coupled to a gate of the low-side power tube and an output terminal coupled to the feedback input terminal of the dead time generation circuit based on the gate voltage detection and the feedback input terminal of the low-side gate charge/discharge accelerating circuit, and the output terminal of the low-side gate charge/discharge accelerating circuit is coupled to a gate of the low-side power tube.

2. The low-radiation interference, high-efficiency, high-linearity, and high-robustness power tube driver of the class-D audio amplifier according to claim 1, wherein the high-side gate voltage detection circuit and the low-side gate voltage detection circuit have the same structure, and both of them comprise a comparator I and a comparator II which are two identical comparators, and a corresponding input terminal of the comparator I and the comparator II is coupled to the gates of the high-side power tube or the low-side power tube, and another corresponding input terminal of the comparator I and the comparator II is coupled to a gate detection level I and a gate detection level II; and the gate detection level II has a voltage equal to a threshold voltage for turning on the high-side power tube or the low-side power tube, and the gate detection level I has a voltage higher than that of the gate detection level II; and the output of the comparator I is a gate detection output I, and the output of the comparator II is a gate detection output II.

3. The low-radiation interference, high-efficiency, high-linearity, and high-robustness power tube driver of the class-D audio amplifier according to claim 1, wherein the high-side gate charge/discharge accelerating circuit and the low-side gate charge/discharge accelerating circuit have the same structure, and both comprise a first NOT gate, an OR gate, a NAND gate, a second NOT gate, a NOR gate, gate charge accelerating tube and a gate discharge accelerating tube, and the first NOT gate has an input terminal coupled to a gate detection output II and an output terminal coupled to an input terminal of the OR gate, and another input terminal of the OR gate is coupled to a gate detection output I, and the OR gate has an output terminal coupled to an input terminal of the NAND gate and an input terminal of the second NOT gate, and the second NOT gate has an output terminal coupled to an input terminal of the NOR gate, and the corresponding output terminal of the dead time generation circuit based on the gate voltage detection is coupled to another input terminal of the NAND gate and the other input terminal of the NOR gate, and the NAND gate has an output terminal coupled to a gate of the gate charge accelerating tube, and the gate charge accelerating tube has a drain coupled to the power supply, and the NOR gate has an output terminal coupled to a gate of the gate discharge accelerating tube, and a source of the gate discharge accelerating tube is grounded, and the source of the gate charge accelerating tube and the drain of the gate discharge accelerating tube are jointly coupled to the gates of the high-side power tube or the low-side power tube.

* * * * *